(12) United States Patent
Hwang et al.

(10) Patent No.: US 9,661,771 B2
(45) Date of Patent: May 23, 2017

(54) ELECTRONIC DEVICE AND ELECTRONIC DEVICE INCLUDED IN A COVER

(71) Applicant: Samsung Electronics Co., Ltd., Suwon-si, Gyeonggi-do (KR)

(72) Inventors: Seung Hyun Hwang, Yongin-si (KR); Hong Moon Chun, Yongin-si (KR); Soon Woong Yang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/619,564

(22) Filed: Feb. 11, 2015

(65) Prior Publication Data
US 2015/0245518 A1    Aug. 27, 2015

(30) Foreign Application Priority Data

Feb. 21, 2014 (KR) .................. 10-2014-0020463

(51) Int. Cl.
| | |
|---|---|
| H04B 1/38 | (2015.01) |
| H05K 5/03 | (2006.01) |
| G06F 1/16 | (2006.01) |
| H04M 1/02 | (2006.01) |
| H04M 1/04 | (2006.01) |
| H04M 1/23 | (2006.01) |
| H04M 1/18 | (2006.01) |

(52) U.S. Cl.
CPC ............. *H05K 5/03* (2013.01); *G06F 1/1632* (2013.01); *G06F 1/1656* (2013.01); *H04M 1/0252* (2013.01); *H04M 1/0254* (2013.01); *H04M 1/04* (2013.01); *H04M 1/23* (2013.01); *H04M 1/026* (2013.01); *H04M 1/185* (2013.01)

(58) Field of Classification Search
CPC  H05K 5/03; H04M 1/04; H04M 1/23; H04M 1/0254; G06F 1/1632
USPC .................................. 455/575.1, 575.8, 557
See application file for complete search history.

(56) References Cited

U.S. PATENT DOCUMENTS

| | | | |
|---|---|---|---|
| 7,964,815 B2 | 6/2011 | Asada | |
| 8,162,283 B1 * | 4/2012 | Royz ..................... | F16M 11/10 248/455 |
| 8,204,549 B2 | 6/2012 | Kim et al. | |
| 8,369,908 B2 * | 2/2013 | Hsu ..................... | H04M 1/0235 455/186.2 |

(Continued)

FOREIGN PATENT DOCUMENTS

| | | |
|---|---|---|
| EP | 2 602 973 A1 | 11/2012 |
| KR | 10-2009-0007229 A | 1/2009 |

(Continued)

*Primary Examiner* — M D Talukder
(74) *Attorney, Agent, or Firm* — Jefferson IP Law, LLP

(57) ABSTRACT

An electronic device that can be attached to a cover and an electronic device attached to a cover are provided. The electronic device includes an electronic device body, a recess formed in an outer surface of the electronic device body, a movable member placed in the recess, an elastic member placed in the recess and supporting the movable member, and a retaining member placed in the recess and disposed around the movable member. The elastic member and the movable member are disposed to elastically bias the movable member from an inside of the recess to the outer surface of the electronic device body.

12 Claims, 12 Drawing Sheets

(56) References Cited

U.S. PATENT DOCUMENTS

| | | | |
|---|---|---|---|
| 8,976,522 B2* | 3/2015 | Yen | G06F 1/162 |
| | | | 312/209 |
| 9,124,793 B2* | 9/2015 | Sheu | H04N 5/2259 |
| 9,316,344 B2* | 4/2016 | Le Gette | F16M 11/041 |
| 2004/0097256 A1* | 5/2004 | Kujawski | H04M 1/72527 |
| | | | 455/550.1 |
| 2004/0198416 A1* | 10/2004 | Gardner | H04M 1/0214 |
| | | | 455/550.1 |
| 2007/0037551 A1* | 2/2007 | Piekarz | H04M 1/6091 |
| | | | 455/406 |
| 2008/0311960 A1* | 12/2008 | Kim | H04M 1/0258 |
| | | | 455/569.1 |
| 2009/0010479 A1* | 1/2009 | Chen | H04M 1/03 |
| | | | 381/395 |
| 2009/0014308 A1 | 1/2009 | Asada | |
| 2010/0046150 A1* | 2/2010 | Yao | B60R 11/02 |
| | | | 361/679.01 |
| 2010/0124695 A1 | 5/2010 | Chen et al. | |
| 2010/0302168 A1* | 12/2010 | Giancarlo | G06F 1/1662 |
| | | | 345/169 |
| 2011/0216485 A1* | 9/2011 | Kang | H04M 1/0254 |
| | | | 361/679.01 |
| 2011/0285553 A1 | 11/2011 | Maenpaa et al. | |
| 2012/0153114 A1* | 6/2012 | Yang | F16M 11/22 |
| | | | 248/346.04 |
| 2013/0107428 A1* | 5/2013 | Duan | H04M 1/0247 |
| | | | 361/679.01 |
| 2013/0143435 A1 | 6/2013 | Kim et al. | |
| 2013/0305489 A1* | 11/2013 | Liang | G06F 1/1681 |
| | | | 16/277 |
| 2014/0218855 A1* | 8/2014 | Fujino | G06F 1/1654 |
| | | | 361/679.12 |
| 2015/0055289 A1* | 2/2015 | Chang | G06F 1/1632 |
| | | | 361/679.43 |
| 2015/0245518 A1* | 8/2015 | Hwang | H04M 1/0252 |
| | | | 455/557 |

FOREIGN PATENT DOCUMENTS

| | | |
|---|---|---|
| KR | 10-2010-0006622 A | 1/2010 |
| KR | 10-1337532 B1 | 12/2013 |
| WO | 02/19665 A2 | 3/2002 |

* cited by examiner

ELECTRONIC DEVICE AND ELECTRONIC DEVICE INCLUDED IN A COVER

CROSS-REFERENCE TO RELATED APPLICATION(S)

This application claims the benefit under 35 U.S.C. §119 (a) of a Korean patent application filed on Feb. 21, 2014 in the Korean Intellectual Property Office and assigned Serial number 10-2014-0020463, the entire disclosure of which is hereby incorporated by reference.

TECHNICAL FIELD

The present disclosure relates to an electronic device. More particularly, the present disclosure relates to an electronic device that can be attached to a cover and an electronic device that is attached to the cover.

BACKGROUND

Generally, when a portable electronic device is carried and used, the portable electronic device may include a cover or an accessory for decorating and protecting the electronic device from an external shock or a scratch, or may include a supplementary device for operating an additional function of the electronic device.

For example, when an electronic device including a cover is carried and used, a back plate of the electronic device may be removed and the cover may be attached to the electronic device. Alternatively, a cover including thick latch structures for fixing corners of the electronic device may be fitted on the corners, respectively, without removing the back plate, or a cover for surrounding all edges of the electronic device may be attached to the electronic device.

However, when an electronic device has a structure that does not allow removal of its back plate, it is difficult to attach a cover that is intended to replace the back plate, to the electronic device.

When a cover is fixed at corners of an electronic device or surrounding all edges thereof, the size of a fixing part may be increased to facilitate a removal of the cover. However, this causes a significant increase in the size of the cover, which deteriorates the appearance and portability of the electronic device. Additionally, when the size of the fixing part is significantly decreased, a removal of the cover from the electronic device may be inconvenient.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device or an electronic device including a cover, which addresses a limitation of the related art in which, when a cover, an accessory, or a supplementary device is attached to the electronic device, an improved appearance and/or portability of the electronic device provided by the cover, accessory or supplementary device causes an inconvenient removal thereof.

Another aspect of the present disclosure is to provide an electronic device or an electronic device including a cover, which facilitates a removal of the cover without sacrificing the appearance and portability of the electronic device.

In accordance with an aspect of the present disclosure, an electronic device is provided. The electronic device includes an electronic device body, a recess formed in an outer surface of the electronic device body, a movable member placed in the recess, an elastic member placed in the recess and supporting the movable member, and a retaining member placed in the recess and disposed around the movable member, wherein the elastic member and the movable member are disposed to elastically bias the movable member from an inside of the recess to the outer surface of the electronic device body.

In accordance with another aspect of the present disclosure, an electronic device attachable to a cover is provided. The electronic device includes an electronic device body including an installation space part, a movable cap that is pressed from an outer surface of the electronic device body to an inside of the electronic device, and a cover holding unit installed in the installation space part, wherein, when the cover holding unit is installed in the installation space part, a surface of the cover holding unit oriented to the outer surface of the electronic device body is exposed to an outside of the electronic device body.

In accordance with another aspect of the present disclosure, an electronic device attachable to a cover is provided. The electronic device includes a cover holding unit, wherein the cover holding unit includes a movable cap that is pressed to an inside of the electronic device, wherein, when the cover is not attached to the electronic device, the movable cap is exposed through an outer surface of the electronic device.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
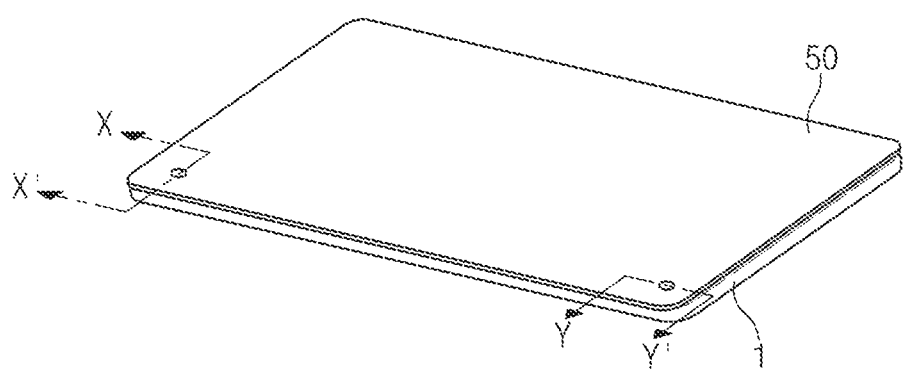
FIG. 1 is a perspective view illustrating a cover attached to an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "include," "comprise," "including," and/or "comprising" used herein indicate disclosed functions, operations, and/or an existence of elements but do not exclude other functions, operations or elements. It should be further understood that the terms "include," "comprise," "have," "including," "comprising," or "having" used herein specify the presence of stated features, integers, steps, operations, elements, components, or combinations thereof but do not preclude the presence or addition of one or more other features, integers, steps, operations, elements, components, or combinations thereof.

The meaning of the term "or" used herein includes any combination of words connected by the term "or". For example, the expression "A or B" may indicate A, B, or both A and B.

The terms such as "first," "second," and the like used herein may refer to various elements of the present disclosure, but do not limit the elements. Moreover, such terms do not limit the order and/or priority of the elements. Furthermore, such terms may be used to distinguish one element from another element. For example, a first user device and a second user device indicate different user devices. For example, without departing from the scope of rights of the present disclosure, a first element may be referred to as a second element or vice versa.

It will be understood that when an element is referred to as being "connected," "joined," "coupled," or "bound" to another element, it can be directly connected, joined, coupled, or bound to the other element or intervening elements may be present. In contrast, when an element is referred to as being "directly connected," "directly joined," "directly coupled," or "directly bound" to another element, it should be understood that there are no intervening elements.

The terminology used herein is not for delimiting the present disclosure but for describing specific embodiments. The terms of a singular form may include plural forms unless otherwise specified.

The terms used herein, including technical or scientific terms, have the same meanings as understood by those skilled in the art unless otherwise defined herein. The commonly used terms such as those defined in a dictionary should be interpreted in the same context as in the related art and should not be interpreted in an idealized or overly formal sense unless otherwise defined explicitly.

Electronic devices according to the present disclosure may have a communication function. For example, the electronic devices may include at least one of smartphones, tablet personal computers (PCs), mobile phones, video telephones, electronic book readers, desktop PCs, laptop PCs, netbook computers, personal digital assistants (PDAs), portable multimedia players (PMPs), MP3 players, mobile medical devices, cameras, wearable devices (e.g., head-mounted-devices (HMDs) such as electronic glasses), electronic apparel, electronic bracelets, electronic necklaces, electronic appcessories, electronic tattoos, and smart watches.

According to various embodiments, the electronic devices may be smart home appliances having a communication function. The smart home appliances may include at least one of, for example, TVs, digital versatile disc (DVD) players, audio players, refrigerators, air conditioners, cleaners, ovens, microwave ovens, washing machines, air cleaners, set-top boxes, TV boxes (e.g., Samsung HomeSync™, Apple TV™, or Google TV™), game consoles, electronic dictionaries, electronic keys, camcorders, and electronic picture frames.

According to various embodiments, the electronic devices may include at least one of medical devices (e.g., magnetic resonance angiography (MRA) devices, magnetic resonance imaging (MRI) devices, computed tomography (CT) devices, image capturing devices, and ultrasonic devices), navigation devices, global positioning system (GPS) receivers, event data recorders (EDRs), flight data recorders (FDRs), vehicle infotainment devices, electronic equipment for ships (e.g., navigation systems and gyrocompasses), avionics, security devices, head units for vehicles, industrial or home robots, automatic teller's machines (ATMs), and points of sales (POSs).

According to various embodiments, the electronic devices may include at least one of furniture, a portion of buildings/structures, electronic boards, electronic signature receiving devices, projectors, and various measuring devices (e.g., devices for measuring tap water, electricity, gas, or a radio wave), which have a communication function. The electronic devices according to the present disclosure may be at least one combination of the above-described various devices. Furthermore, the electronic devices according to the present disclosure may be flexible devices. Moreover, it would be obvious to those skilled in the art that the electronic devices according to the present disclosure are not limited to the above-described devices.

An electronic device and a cover attached to an electronic device according to various embodiments will now be described with reference to the accompanying drawings. The term "user" used herein may refer to a person who uses an electronic device or to a device (e.g., an artificial intelligence electronic device) that uses an electronic device.

FIGS. 1 through 12, discussed below, and the various embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the present disclosure. Terms first, second, and the like are used to differentiate between objects having the same terminology and are in no way intended to represent a chronological order, unless where explicitly stated otherwise. A set is defined as a non-empty set including at least one element.

FIG. 1 is a perspective view illustrating a cover attached to an electronic device according to an embodiment of the present disclosure.

Figure 2:
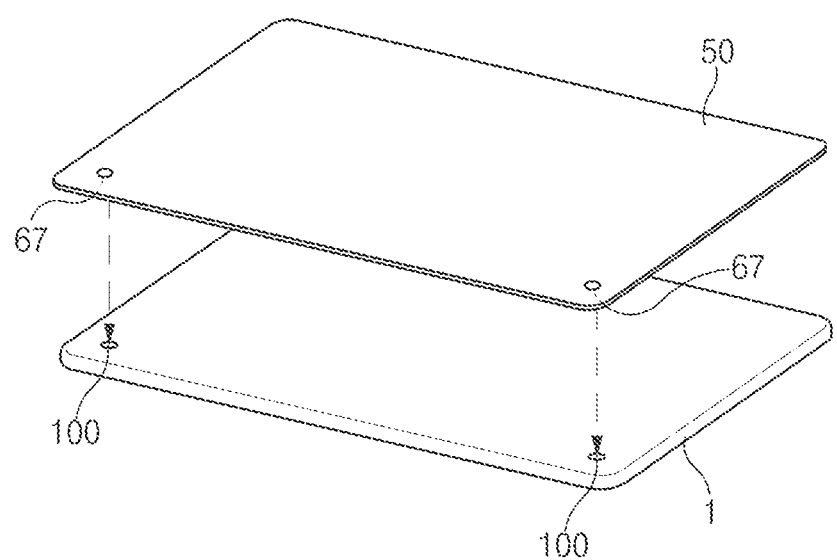
FIG. 2 is a perspective view illustrating a cover before being attached to an electronic device according to an embodiment of the present disclosure.

FIG. 2 is a perspective view illustrating a cover before being attached to an electronic device according to an embodiment of the present disclosure.

Figure 3:
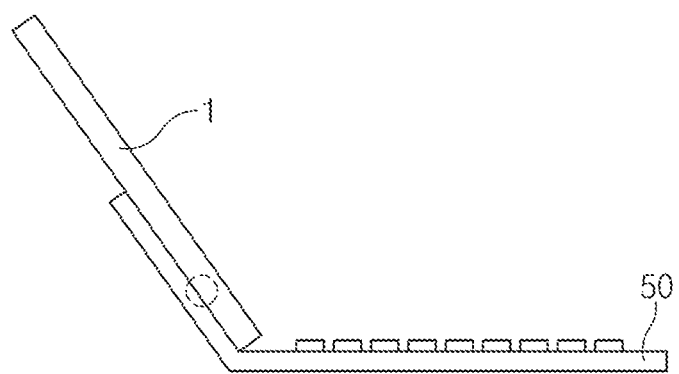
FIG. 3 is a side view illustrating a cover attached to an electronic device according to an embodiment of the present disclosure.

FIG. 3 is a side view illustrating a cover attached to an electronic device according to an embodiment of the present disclosure.

Referring to FIGS. 1 to 3, an electronic device 1 is illustrated, where the electronic device 1 may include cover holding units 100 that are attached to at least one of a connecting protrusion 67. Further, a cover 50 is illustrated, where the cover 50 may include the connecting protrusion 67 and may be attached to the electronic device 1.

The cover 50 may be installed on the electronic device 1 by connecting the connecting protrusions 67 to the cover holding units 100.

Since FIGS. 1 to 3 illustrate, as an example, a whole appearance of the electronic device 1 having the cover 50 attached thereto, specific structures of the connecting protrusions 67 and the cover holding units 100 will be described later with reference to other drawings.

While FIGS. 1 and 2 illustrate that the cover 50 entirely covers an outer surface of the electronic device 1, the cover 50 may cover a portion of the outer surface of the electronic device 1 according to various embodiments of the present disclosure. For example, when the electronic device 1 is a smart phone, a lens part of a camera module is typically exposed through an outer surface of the smart phone. As such, the cover 50 may cover at least one portion of the outer surface of the electronic device 1, except for the lens part. Also, when various input/output members including a speaker, a button key, and a touch pad are exposed through the outer surface of the electronic device 1, the cover 50 may cover at least one portion of the outer surface of the electronic device 1, except for the input/output members. In addition, the cover 50 may be formed of a transparent, opaque, or translucent material.

If the cover 50 is formed of a transparent material, even when the cover 50 covers the lens part, then a camera may perform an image capturing function, regardless of the covering of the lens part. Thus, the cover 50 may cover not only the lens part, but also at least one portion of the outer surface of the electronic device 1. Even when the electronic device 1 is a smart phone, and the cover 50 is formed of an opaque material, the cover 50 may cover a camera if necessary.

When the cover 50 covers the electronic device 1, the cover 50 may be disposed over one portion of the outer surface of the electronic device 1 to cover the electronic device 1, or have a grill type part, a mesh, a hole, or a slit to cover at least one portion of the outer surface of the electronic device 1.

According to various embodiments of the present disclosure, the cover 50 may improve an appearance of the electronic device 1 or protect the electronic device 1 from an external shock or scratch, and include an accessory attached to the electronic device 1. The cover 50 may further include or be a supplementary device attached to the electronic device 1 to operate an additional function of the electronic device 1.

For example, referring to FIG. 3, at least part of the cover 50 may include a detachable keyboard. In another example, the electronic device 1 may include a separate detachable keyboard. The detachable keyboard may be installed on a portion of a display part of the electronic device 1, instead of applying a soft key thereon. A circle illustrated in FIG. 3, which is depicted with a dotted line, denotes a coupling part where the detachable keyboard is attached to the electronic device 1, and the detachable keyboard may include a separate electric contact point on the coupling part. The detachable keyboard may transmit a key input signal to the electronic device 1 through the electric contact point or communication with the electronic device 1.

Referring to FIGS. 1 and 2, the cover holding units 100 are disposed at two corners of the electronic device 1 in a vertical direction thereof, and the connecting protrusions 67 are formed in locations on the cover 50 corresponding to the cover holding units 100, respectively. Alternatively, the electronic device 1 may include at least two cover holding units 100 formed in a horizontal or diagonal direction thereof. When the electronic device 1 has an approximately rectangular shape, the cover holding units 100 may be disposed at three or four corners of the electronic device 1.

The electronic device 1 may have a polygonal shape or a curved square shape, instead of a rectangular shape. According to various embodiments, the electronic device 1 may have an approximately circular or oval shape.

The cover holding unit 100 may be formed not only at a corner of the electronic device 1 or a region adjacent to the corner, but also in the central part of each side of the electronic device 1 between corners. Alternatively, the cover holding unit 100 may be formed in a central portion of the outer surface of the electronic device 1. "The central portion" includes not only the geometrical center but also a region between the geometrical center and a corner. According to various embodiments, the cover holding unit 100 may be formed at a side of the electronic device.

Figure 4:
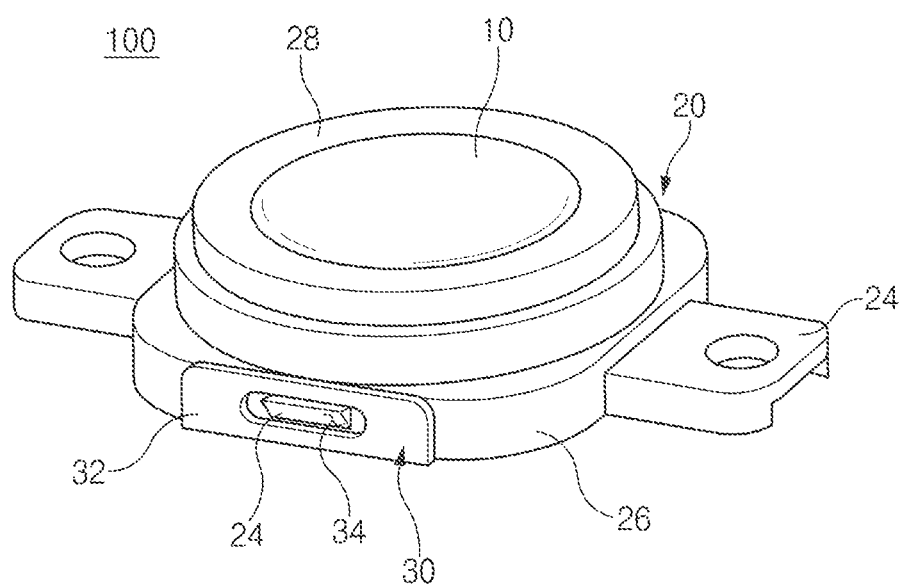
FIG. 4 is a perspective view illustrating a cover holding unit installed on an electronic device according to an embodiment of the present disclosure.

FIG. 4 is a perspective view illustrating a cover holding unit installed on an electronic device according to an embodiment of the present disclosure.

Figure 5:
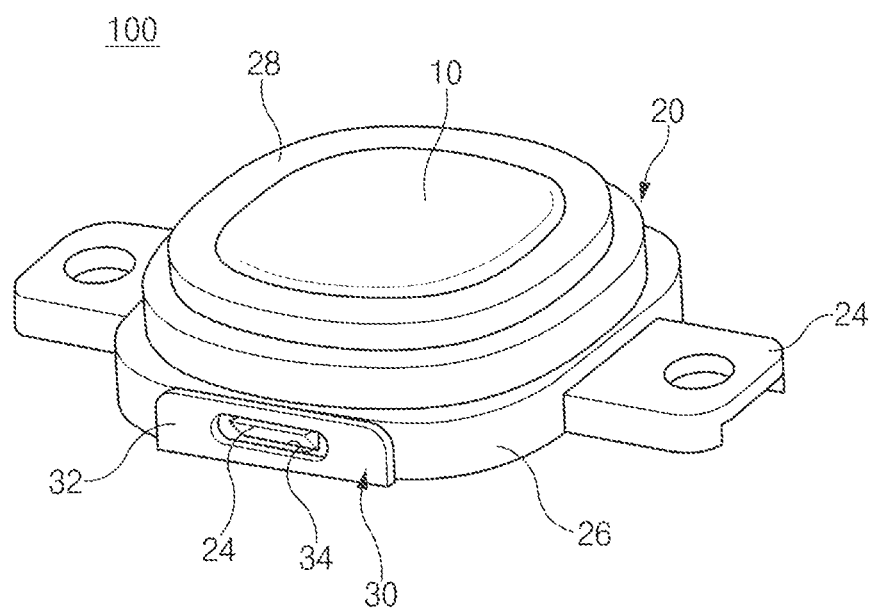
FIG. 5 is a perspective view illustrating a cover holding unit according to an embodiment of the present disclosure.

FIG. 5 is a perspective view illustrating a modification of a cover holding unit according to an embodiment of the present disclosure.

Referring to FIGS. 4 and 5, a cover holding unit 100 may include: a movable cap 10 that is pressed inward by a connecting protrusion (for example, the connecting protrusions 67 as illustrated in FIG. 2); a housing 20 that supports/places the movable cap 10; and a base plate 30 that covers an inner end part 26 of the housing 20. When the inner end part 26 or an outer end part 28 of the housing 20 and the movable cap 10 are pressed "inward," the term "inward" is determined by a state that the cover holding unit 100 is installed on the electronic device 1. In particular, the term "outward" means "to an outer surface of an electronic device body," and the term "inward" means "to an inner space of the electronic device body."

The cover holding unit 100 may include installation brackets 24 to install the cover holding unit 100 on an electronic device body (for example, the electronic device body 2 of FIG. 6), and the installation brackets 24 may be formed, for example, on side parts of the housing 20. Alternatively, according to various embodiments, the installation brackets 24 may be installed on the base plate 30, instead of on the housing 20. For example, installation brackets may extend in a lateral direction of the cover holding unit 100 from the base plate 30 in locations corresponding to the installation brackets 24 illustrated in FIGS. 4 and 5. The base plate 30 covering the inner end part 26 of the housing 20 may include wing parts 32 on both end parts thereof, and the wing parts 32 may have an upwardly bent shape and be provided with slots 34.

Figure 6:
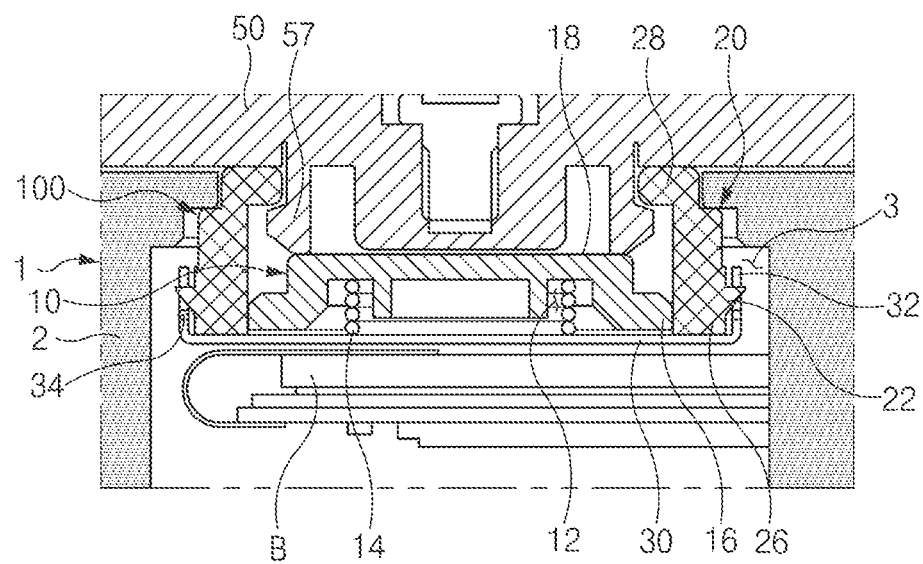
FIG. 6 is a cross-sectional view taken along line X-X' of FIG. 1 according to an embodiment of the present disclosure.

FIG. 6 is a cross-sectional view taken along line X-X' of FIG. 1 according to an embodiment of the present disclosure.

Figure 7:
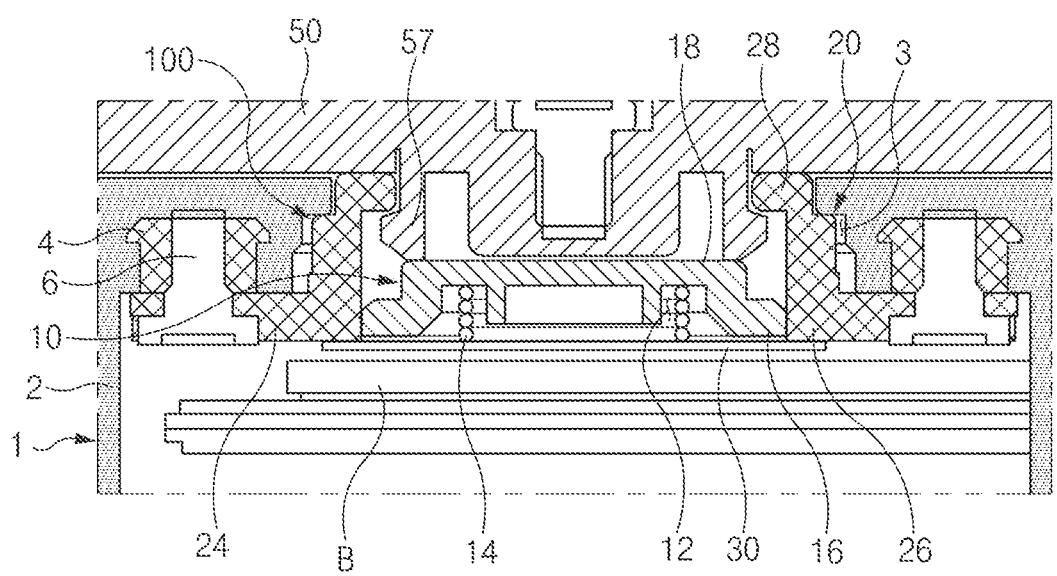
FIG. 7 is a cross-sectional view taken along line Y-Y' of FIG. 1 according to an embodiment of the present disclosure.

FIG. 7 is a cross-sectional view taken along line Y-Y' of FIG. 1 according to an embodiment of the present disclosure.

A further specified structure of cover holding units 100, and portions of an electronic device 1 on which the cover holding units 100 are installed will now be described with reference to FIGS. 6 and 7.

Referring to FIGS. 6 and 7, an electronic device 1 and a cover 50 are illustrated, where the cover 50 includes a protrusion 57 and the electronic device 1 includes an electronic device body 2 that functions as a frame on which various electronic parts or mechanical parts are installed, and installation space parts 3 are formed in the electronic device body 2. The installation space parts 3 may be cavities formed to the inside of the electronic device body 2 from an outer surface of the electronic device body 2, and the cover holding units 100 may be installed in the installation space parts 3. Thus, when the cover holding units 100 are installed in the installation space parts 3, at least one portion of a surface of the cover holding units 100 oriented to the outer surface of the electronic device body 2 may be exposed to the outside thereof.

The cover holding units 100 may include: a movable cap 10 that is pressed inward from the outer surface of the electronic device body 2; and a housing 20 that places the movable cap 10 and is installed in the installation space parts 3.

The movable cap 10 may include an outer end part 18 and may be vertically moved from inside of the housing 20 along an inner wall surface of the housing 20 when being viewed from FIGS. 6 and 7.

The cover holding units 100 may further include an elastic member 14 placed in the housing 20 to elastically bias the movable cap 10 to an outer surface of the electronic device body 2. The elastic member 14 may be a coil spring as illustrated in FIGS. 6 and 7, a leaf spring, or a pneumatic or hydraulic spring.

When the elastic member 14 is a coil spring, when being viewed from FIGS. 6 and 7, the coil spring may have a cylindrical shape, the upper and lower end parts of which are the same in diameter, or a conic shape, the upper and lower end parts of which are different in diameter. Since a distance between the upper and lower end parts of the conic shape is smaller than the distance between the upper and lower end parts of the cylindrical shape under a maximum compression condition, when the coil spring has the conic shape, a distance between an inner end part 26 and an outer end part 28 of the housing 20 is decreased, thereby slimming the cover holding unit 100.

The upper end part of the elastic member 14 may be placed in an elastic member seat part 12 formed in a lower end part of the movable cap 10, and the elastic member seat part 12 may be a recess space formed in a region closer to the central part of the movable cap 10 than to an inner end part 16 of the movable cap 10. According to various embodiments of the present disclosure, referring to FIGS. 6 and 7, a protrusion may be formed in a central portion of the elastic member seat part 12 to prevent a movement of the elastic member 14 and is fitted in a central penetrating part of the coil spring formed in a compression direction and an extension direction thereof.

The electronic device 1 may have a significantly small inner space to cope with a miniaturization trend. Thus, the installation space parts 3 should be disposed in the inner space of the electronic device 1, and the cover holding units 100 should be installed in the installation space parts 3. To this end, miniaturization of the cover holding units 100 is needed. Specifically, since slimming of the electronic device 1 may be needed, slimming of the cover holding unit 100 may also be needed.

The cover holding units 100 may be slimmed by making the housing 20 flat. Alternatively, referring to FIGS. 4 to 7, the cover holding units 100 may be slimmed according to the embodiment in which the cover holding units 100 include a base plate 30 covering the inner end part 26 of the housing 20.

The housing 20 may be formed of a metal. Alternatively, the housing 20 may be formed of a plastic that is superior to the metal, in terms of cost and process efficiency. However, the thickness of the housing 20 may be increased to ensure sufficient strength thereof. The vertical thickness of a housing 20 according to an embodiment in which the housing 20 supports the lower end part of the elastic member 14 may be greater than that of the housing 20, as illustrated in FIG. 6.

Thus, the base plate 30, which is thinner than the housing 20, is disposed on the lower end part of the housing 20 when being viewed from FIG. 6, that is, on the inner end part 26 of the housing 20, so as to further slim the cover holding unit 100. In this case, the inner end part 26 of the housing 20 may be formed as an open part, and the housing 20 may have a flat tubular shape, and the base plate 30 may cover the open part of the inner end part 26 of the housing 20, as the open part, thereby minimizing the effect of the housing 20 on the thickness of the cover holding unit 100.

In this case, as established above and as illustrated in FIGS. 6 and 7, the base plate 30 is thinner than the housing 20. In addition, when the housing 20 is formed of plastic, the base plate 30 may be formed of a metal to ensure sufficient strength thereof.

An open tubular shape in which both the inner end part 26 and the outer end part 28 are open may be superior to a closed tubular shape in which only the outer end part 28 is open, in terms of manufacturing efficiency of the housing 20. Thus, the housing 20 and the base plate 30 may be formed of the same material to improve the manufacturing efficiency of the housing 20.

When the inner end part 26 of the housing 20 as the open part is covered with the base plate 30 according to the embodiments of the present disclosure, as illustrated in FIGS. 6 and 7, the elastic member 14 may be disposed between the movable cap 10 and the base plate 30.

The base plate 30 covering the inner end part 26 of the housing 20 may include wing parts 32 on both end parts thereof, and the wing parts 32 may have an upwardly bent shape and be provided with slots 34. Latches 22 may be formed on side surfaces of the housing 20, and the slots 34 may be fitted on the latches 22 to fix the wing parts 32. As such, the base plate 30 may be fixed to the housing 20 in a snap-tight manner. Alternatively, the base plate 30 may be adhered, fusion-bonded, or welded to the housing 20.

Referring to FIG. 7, installation brackets 24 may be connected to the electronic device body 2 to prevent the cover holding unit 100 installed in the installation space parts 3, from being removed from the electronic device body 2. More particularly, inserts 4 are installed on the electronic device body 2 in regions corresponding to the installation brackets 24 of the electronic device body 2, and connecting bolts 6 are attached to the inserts 4 contacting through holes formed in the installation brackets 24, thereby fixing the cover holding units 100 to the installation space parts 3.

Even when the cover holding units 100 are removed from and attached to the installation space parts 3 several times to repair or replace the cover holding units 100 in the embodiment of the present disclosure in which the inserts 4 are installed on the electronic device body 2 in the regions corresponding to the installation brackets 24 of the electronic device body 2, since the possibility that screw threads of the connecting bolts 6 damage the inserts 4 is low, the repair or replacement of the cover holding units 100 is convenient. When the connecting bolts 6 are formed of a metal, the inserts 4 are also formed of a metal. According to various embodiments of the present disclosure, connecting bolt coupling holes may be formed in the regions corresponding to the installation brackets 24 of the electronic device body 2 without the inserts 4. The connecting bolts 6 may be replaced with connecting pins.

The installation brackets 24 of the cover holding units 100, which are illustrated in FIGS. 4 to 7, have the through holes in which the connecting bolts 6 are fitted, but may be provided without the through holes. For example, protrusions may be formed on the installation brackets 24, and recesses may be formed in regions corresponding to the inserts 4, as illustrated in FIG. 7. Accordingly, the protrusions of the installation brackets 24 may be fitted in the recesses, thereby installing the cover holding unit 100s in the installation space parts 3. Alternatively, the installation brackets 24 may be provided without through holes or protrusions, and the installation space parts 3 may have shapes corresponding to the installation brackets 24, so that the installation brackets 24 may be placed in the installation space parts 3. The installation brackets 24 may be adhered, fusion-bonded, or welded to the installation space parts 3.

As such, the housing 20 may be fixed to the installation space parts 3 by bolts or pins or through fusion-bonding or welding. Although a number of the installation brackets 24 included in the cover holding units 100 illustrated in FIGS. 4 to 7 is two, the number of the installation brackets 24 may be zero, one, or three or more. For example, although the cover holding units 100 are provided without the installation brackets 24, when the housing 20 includes a raised part caught by an opening part of the installation space parts 3 (that is, the outer end part 28 of the housing 20 has a stepped shape), and an inner wall of the installation space parts 3 at the opening part thereof has a structure caught by the raised part, as illustrated in FIGS. 4 to 7, the housing 20 is prevented from being removed from the electronic device body 2 at least through the opening part of the installation space parts 3.

A structure B including a circuit board for driving the electronic device 1 may be disposed at an inner end part of the cover holding units 100 and fix and immobilize the inner end part of the cover holding units 100. Since the outer end part 28 of the housing 20 having a stepped shape is caught by the inner wall of the installation space parts 3 at the opening part thereof as described above, an outer end part and the inner end part of the cover holding units 100 are fixed. Thus, although the installation brackets 24 are not provided, the cover holding units 100 may be stably installed on the electronic device body 2 according to an embodiment.

Figure 8:
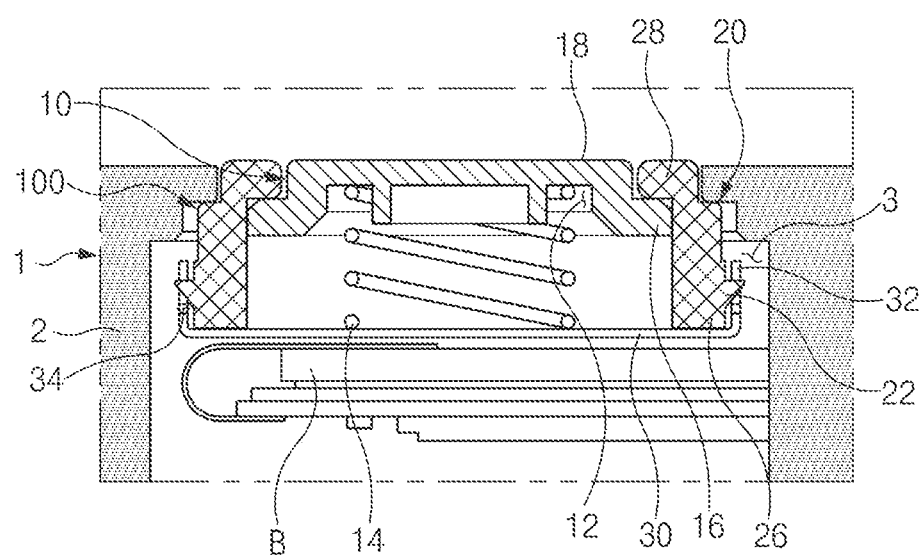
FIG. 8 is a cross-sectional view illustrating a state that a cover is removed from an electronic device according to an embodiment of the present disclosure.

FIG. 8 is a cross-sectional view illustrating a state that in which a cover is removed from an electronic device according to an embodiment of the present disclosure.

Figure 9:
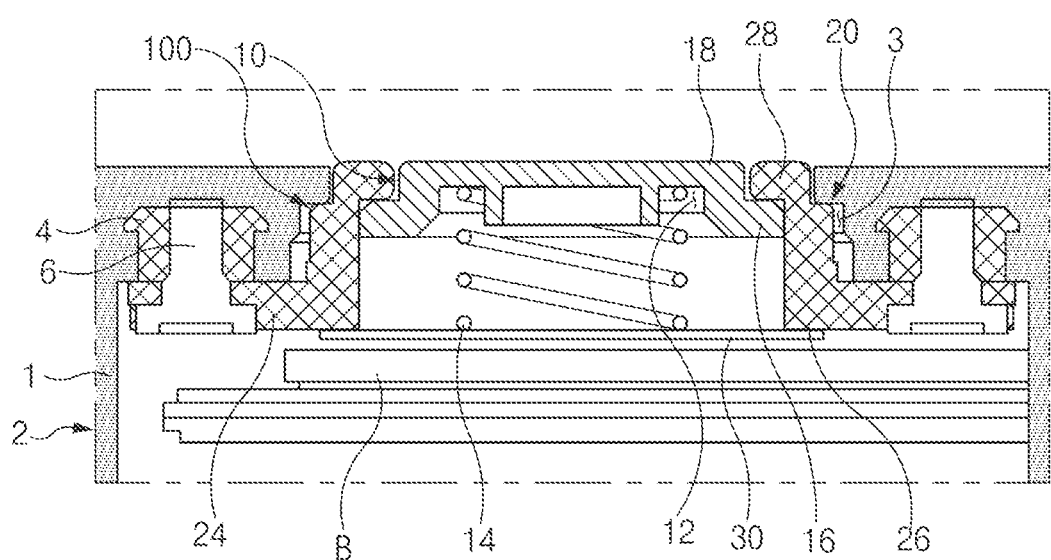
FIG. 9 is a cross-sectional view illustrating a state that a cover is removed from an electronic device according to an embodiment of the present disclosure.

FIG. 9 is a cross-sectional view illustrating a state that in which a cover is removed from an electronic device according to an embodiment of the present disclosure.

When FIGS. 6 and 7 are compared with FIGS. 8 and 9, respectively, it could be understood that: a cover holding unit 100 including a movable cap 10 that is pressed inward is installed on an electronic device 1 attached to a cover 50 according to various embodiments of the present disclosure; and when the cover 50 is not installed over the cover holding unit 100, the movable cap 10 is exposed through an outer surface of an electronic device 1.

That is, when a connecting protrusion 67, as illustrated in FIG. 2, is formed on the cover 50 and presses the movable cap 10, the connecting protrusion 67 is installed on the cover holding unit 100 with the movable cap 10 pressed. When the connecting protrusion 67 is removed from the cover holding unit 100, the movable cap 10 may return to the original state thereof.

The wording "the movable cap 10 may return to the original state thereof" means that: the movable cap 10 may return from the state that the movable cap 10 is pressed (refer to FIGS. 6 and 7) to the state that the movable cap 10 is exposed through an outer surface of the electronic device 1 (refer to FIGS. 8 and 9); and the movable cap 10 may be prevented from being removed out of housing 20.

The movable cap 10 may include a raised part caught by an outer end part 28 of the housing 20 to prevent the movable cap 10 from being removed out of the housing 20. For example, referring to FIGS. 6 to 9, an inner end part 16 of the movable cap 10 may have a stepped shape, and the outer end part 28 of the housing 20 may have a width smaller than that of the inner end part 16 of the movable cap 10. Accordingly, even when an elastic member 14 is extended such that the movable cap 10 reaches an upper limit thereof (refer to FIGS. 8 and 9), the inner end part 16 of the movable cap 10 is caught by the outer end part 28 of the housing 20 to prevent the movable cap 10 from being removed out of the housing 20.

When the movable cap 10 is not pressed by the connecting protrusion 67, the movable cap 10 may be flush with the outer surface of the electronic device 1. The meaning of the wording "flush with" includes not only the meaning of the wording "mathematically and ideally flush with", but also the meaning of the wording "slightly protruded or recessed from the outer surface of the electronic device 1 as illustrated in FIGS. 8 and 9". For example, even when an outer end part 18 of the movable cap 10 is flat and is slightly protruded or recessed, as a whole, from the state thereof illustrated in FIGS. 8 and 9, the wording "the movable cap 10 is flush with the outer surface of the electronic device 1" may be used. In addition, even when the outer end part 18 of the movable cap 10 is slightly concave or convex from the state thereof illustrated in FIGS. 8 and 9, the wording "the movable cap 10 is flush with the outer surface of the electronic device 1" may also be used.

According to an embodiment of the present disclosure, the electronic device 1 may include: an electronic device body 2; a recess formed in an outer surface of the electronic device body 2; the movable cap (e.g., a movable member) 10 placed in the recess; the elastic member 14 placed in the recess and supporting the movable member 10; and the housing (e.g., a retaining member) 20 placed in the recess and disposed around the movable member 10. The elastic member 14 and the movable member 10 may be disposed to elastically bias the movable member 10 from the inside of the recess to the outer surface of the electronic device body 2.

The electronic device 1 may further include a supplementary apparatus configured to be connected to at least one portion of the electronic device body 2. The supplementary apparatus may include a protrusion part 67, as illustrated in FIG. 2, inserted in the recess to press the movable member 10.

Since the elastic member 14 elastically biases the movable member 10, when the protrusion part 67 of the supplementary apparatus is not attached to the recess of the electronic device 1, the outer surface of the uppermost end of the movable member 10 may be substantially flush with the outer surface of the electronic device body 2. The meaning of the wording "substantially flush with" includes not only the meaning of the wording "completely and geometrically flush with," but also the meaning of the wording "the outer surface of the uppermost end of the movable member 10 may be slightly protruded or recessed from the outer surface of the electronic device body 2."

The supplementary apparatus may further include connecting parts inserted in the recess and removably attached to the retaining member 20.

Additionally, FIGS. 8 and 9 illustrate installation space parts 3, inserts 4, bolts 6, a seat part 12, latches 22, installation brackets 24, a base plate 30, wing parts 32, slots 34, and a structure B as discussed above regarding FIGS. 6 and 7.

The electronic device 1 may include a mobile electronic device, and the supplementary apparatus may be the cover 50 for covering at least one portion of the electronic device 1. Furthermore, the supplementary apparatus may include a keyboard for performing an input operation on the electronic device 1.

A first electrical connector (not illustrated) may be formed in the recess of the electronic device body 2, and the supplementary apparatus may include a second electrical connector (not illustrated) that is inserted in the recess. The second electrical connector may be formed on the protrusion part 67. When the protrusion part 67 is inserted in the recess, the second electrical connector may be electrically connected to the first electrical connector.

Figure 10:
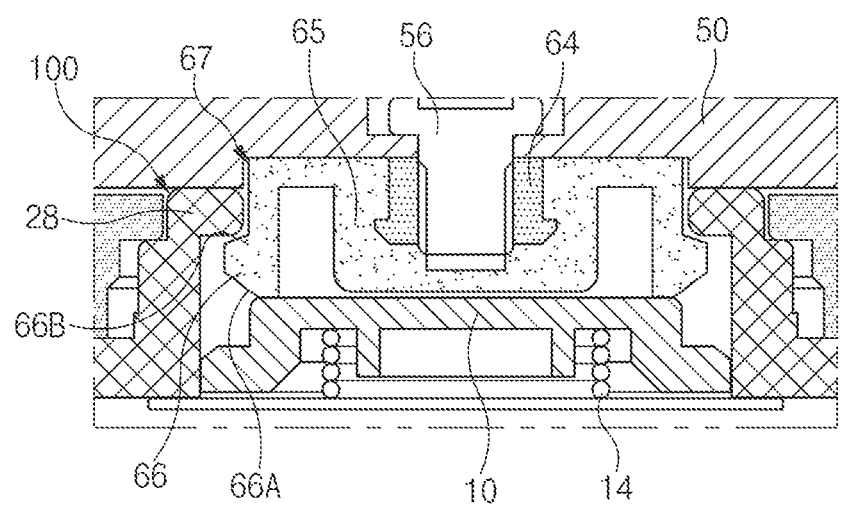
FIG. 10 is a cross-sectional view taken along line Y-Y' of FIG. 1, which illustrates a connecting protrusion formed on a cover according to an embodiment of the present disclosure.

FIG. 10 is a cross-sectional view taken along line Y-Y' of FIG. 1, which illustrates a connecting protrusion formed on a cover according to an embodiment of the present disclosure.

According to an embodiment, the present disclosure discloses a cover holding unit comprising a housing, a movable cap, an outer end part, an installation brackets and an elastic member placed in the housing to elastically bias the movable cap to the outer surface, and electric contact point which is coupled electrically between an external device and an electronic device included (or attached, or coupled) the cover holding unit while the movable cap is connected to the external device.

Referring to FIG. 10, when a movable cap 10 is pressed inward in the state illustrated in FIGS. 8 and 9, and a connecting protrusion 67 formed on a cover 50 is fitted in a housing, the connecting protrusion 67 may be elastically connected to a cover holding unit 100, which is illustrated in FIG. 10.

The connecting protrusion 67 may include: a protrusion main body 65 protruding from an outer surface of the cover 50; and hooks 66 formed on an outer surface of a front end part of the protrusion main body 65 (a lower end part of the protrusion main body 65 when being viewed from FIG. 10) and elastically connected to the cover holding unit 100.

In a state where the connecting protrusion 67 is not attached to the cover holding unit 100, when the connecting protrusion 67 presses the movable cap 10, sliding surfaces 66A of the hooks 66 contact an outer end part 28 of the housing. Then, when the connecting protrusion 67 further presses the movable cap 10, the sliding surfaces 66A slide on the outer end part 28 of the housing, and the hooks 66 come closer to each other. When the connecting protrusion 67 presses the movable cap 10 by a degree illustrated in FIG. 10, the hooks 66 spread, and supporting surfaces 66B of the hooks 66 are caught by the outer end part 28 of the housing.

In contrast, when the cover 50 is removed from an electronic device, the cover 50 is pulled out. At this point, the supporting surfaces 66B of the hooks 66 slide on the outer end part 28 of the housing, and the hooks 66 come closer to each other. Then, when the cover 50 is fully pushed out, the hooks 66 are removed out of the outer end part 28 of the housing and spread. Accordingly, the connecting protrusion 67 is completely removed from the cover holding unit 100. Since an elastic member 14 elastically biases the movable cap 10 to the outer surface of the electronic device, the movable cap 10 is in contact with the connecting protrusion 67 until the connecting protrusion 67 is removed from the cover holding unit 100.

Thus, before the connecting protrusion 67 is fitted in the cover holding unit 100, the movable cap 10 is flush with the outer surface of the electronic device 1. When the connecting protrusion 67 is fitted in the cover holding unit 100, the movable cap 10 is pressed to the inside of the housing. When the connecting protrusion 67 is removed from the cover holding unit 100, the movable cap 10 returns to the state of being flush with the outer surface of the electronic device. Thus, when the cover 50 is not attached to the electronic device 1, an unnecessary recess is prevented from being formed in the outer surface of the electronic device 1, thereby improving the appearance of the electronic device.

An inclination of the sliding surfaces 66A of the hooks 66 from a horizontal direction of FIG. 10 is greater than that of the supporting surfaces 66B. Thus, when the sliding surfaces 66A contact the outer end part 28 of the housing (when the cover 50 is installed on the cover holding unit 100), the hooks 66 are deformed with relatively small force. When the supporting surfaces 66B contact the outer end part 28 of the housing 20 (when the cover 50 is removed from the cover holding unit 100), the hooks 66 are deformed with relatively great force.

As such, a force needed to install the connecting protrusion 67 on the cover holding unit 100 is smaller than a force needed to remove the connecting protrusion 67 from the cover holding unit 100 in the embodiment illustrated in FIG. 10, the cover 50 may be easily attached to the electronic device with relatively small force. When the cover 50 is attached to the electronic device, the cover 50 is prevented from being easily removed from the electronic device 1 by a small shock applied to the electronic device or small force pulling the cover 50. Thus, according to the current embodiment, the cover 50 is prevented from being undesirably and easily removed from the electronic device by external force when a user generally uses the electronic device.

In addition, referring to FIG. 10, an insert 64 is installed on the connecting protrusion 67, and a connecting bolt 56 is attached to the insert 64 contacting a through hole formed in the cover 50, thereby coupling the connecting protrusion 67 to the cover 50. Since the protrusion main body 65 and the hooks 66 are integrally formed to constitute the connecting protrusion 67 as illustrated in FIG. 10, the protrusion main body 65 and the hooks 66 may be formed of the same material, for example, a polycarbonate or polyurethane material.

Figure 11:
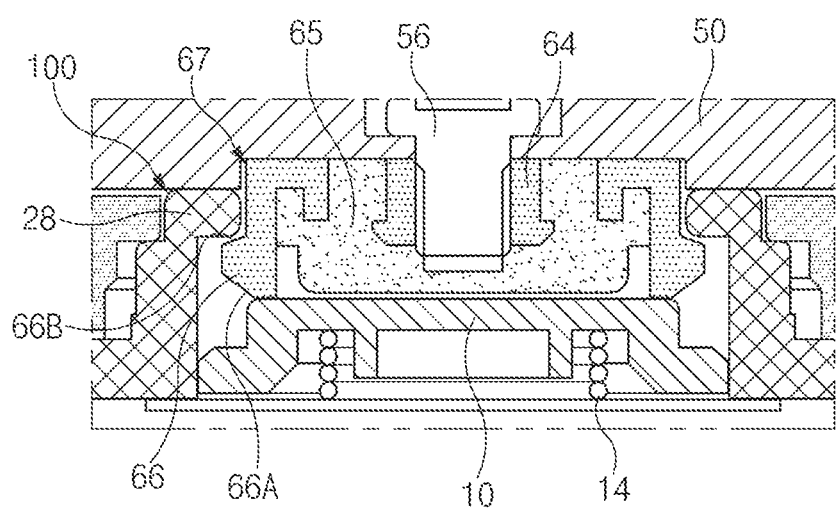
FIG. 11 is a cross-sectional view taken along line Y-Y' of FIG. 1, which illustrates a modification of a connecting protrusion formed on a cover according to an embodiment of the present disclosure.

FIG. 11 is a cross-sectional view taken along line Y-Y' of FIG. 1, which illustrates a modification of a connecting protrusion formed on the cover according to an embodiment of the present disclosure.

An embodiment as illustrated in FIG. 1 is different from the embodiment as illustrated in FIG. 10 in that the protrusion main body 65 and the hooks 66 are separately formed. Thus, a difference between the configuration of the current embodiment and that of the embodiment of FIG. 10 will now be described, except for the same configuration.

Referring to FIG. 11, an insert 64 may be inserted in a connecting protrusion 67 to maintain stable coupling of the connecting protrusion 67 to a cover 50 even when the cover 50 is innumerably attached to and removed from the cover holding unit 100. Even when a connecting bolt 56 is stably attached to the insert 64, if the protrusion main body 65 is removed from the insert 64, the connecting protrusion 67 is removed from the cover 50. To prevent this removal, the insert 64 may be fixed to the inside of the protrusion main body 65 with sufficient strength, and the protrusion main body 65 may be formed of a material having sufficient hardness, for example, a polycarbonate material. The hooks 66 may be formed of a more flexible material than the material for the protrusion main body 65 to smoothly attach and remove the hooks 66 to and from the outer end part 28 of the housing 20. For example, the hooks 66 may be formed of a urethane material. Further, an elastic member 14 elastically biases a movable cap 10 to the outer surface of the electronic device.

Referring to FIGS. 10 and 11, the sliding surfaces 66A and the supporting surfaces 66B of the hooks 66 are inclined, and the upper and lower surfaces of the outer end part 28 of the housing 20 are substantially rectangular. On the contrary, the sliding surfaces 66A and the supporting surfaces 66B of the hooks 66 may be substantially rectangular, and the upper and lower surfaces of the outer end part 28 of the housing 20 may be inclined. Also in this case, the hooks 66 may be elastically deformed to be removed from and attached to the cover holding unit 100, as in the embodiment illustrated in FIG. 10. According to an embodiment, the sliding surfaces 66A and the supporting surfaces 66B of the hooks 66, and the upper and lower surfaces of the outer end part 28 may be inclined.

When the upper and lower surfaces of the outer end part 28 of the housing 20 are inclined, an inclination of the upper surface of the outer end part 28 of the housing 20 may be greater than that of the lower surface thereof such that a force needed to install the connecting protrusion 67 on the cover holding unit 100 is smaller than a force needed to remove the connecting protrusion 67 from the cover holding unit 100.

The connecting protrusion 67 fitted in the cover holding unit 100, as illustrated in FIG. 4 may have a vertically formed flat circular pipe shape as a whole, and a boundary of the connecting protrusion 67 is not limited to a closed curve.

That is, a connecting direction of the connecting protrusion 67 is a vertical direction when being viewed from FIG. 4, and a plurality of slots 34 may be vertically formed in the connecting protrusion 67. As a result, pieces, which have shapes formed by cutting a circular pipe a plurality of times in the longitudinal direction thereof, may constitute a circular pipe shape as a whole.

That is, the boundary of the connecting protrusion 67 may be formed in a closed curve or be constituted by a plurality of protrusion pieces separated by the slots 34 recessed in the connecting direction. That is, a plurality of neighboring protrusion pieces with the slots 34 therebetween may constitute the connecting protrusion 67.

According to various embodiments of the present disclosure, the electronic device 1 and the cover 50 may be removed from and attached to each other just by removing and attaching the connecting protrusion 67 formed on the cover 50, from and to the cover holding unit 100, unlike the related art in which: a back plate of an electronic device is removed to install a replacement cover; corner portions of an electronic device are caught by thick latch structures, respectively; or a cover surrounding all edges of an electronic device is attached to the electronic device. Thus, a connecting structure for connecting the cover 50 to the electronic device 1 can be miniaturized, and the appearance and portability of the electronic device 1 can be improved.

In the related art, the size of a connecting structure is increased to easily remove a cover, thereby increasing the size of the electronic device attached to the cover. On the contrary, when the size of a connecting structure is decreased to decrease the size of an electronic device, a removal of a cover is difficult. However, since the cover 50 is installed on the electronic device 1 by fitting the connecting protrusion 67 in the cover holding unit 100 according to various embodiments of the present disclosure, the connecting structure is not exposed from the electronic device 1 or the cover 50 in the state where the cover 50 has been attached to the electronic device 1, so that the size of the electronic device 1 attached to the cover 50 can be decreased. Furthermore, unlike the related art in which a connecting structure formed on a cover should be pulled by hand to remove the cover from an electronic device, the cover 50 according to various embodiments of the present disclosure is pulled by hand, instead of the connecting protrusion 67, to remove the cover 50. Thus, although the connecting structure is small, the removal of the cover 50 is convenient.

That is, "miniaturization of a connecting structure" and "a convenient removal of a cover," which cannot be simultaneously achieved in the related art, can be simultaneously achieved according to various embodiments of the present disclosure.

Since electronic devices are different in shape, area, thickness, and corner curvature, cover connecting structure optimized for various electronic devices should be individually designed in the related art. However, according to various embodiments of the present disclosure, the cover holding unit 100 is modularized for common use, so that the cover holding unit 100 can be installed on various electronic devices. Accordingly, a common cover connecting structure can be formed.

In addition, unlike the related art in which a cover for covering all corners of an electronic device or all edges thereof is installed on the electronic device, the cover holding unit 100 according to various embodiments of the present disclosure may be disposed in a region adjacent to a corner of the electronic device 1 or the central part of the electronic device 1 or be freely disposed in the horizontal or vertical direction of the electronic device 1. In addition, the electronic device 1 may not be entirely covered by the cover 50. Thus, the area or shape of the cover 50 can be freely designed with a high degree of freedom.

In addition, for example, even when a first cover and a second cover to be attached to a specific electronic device are different in area or shape, it is unnecessary to change the connecting structure for connecting the cover 50 to the electronic device 1.

Figure 12:
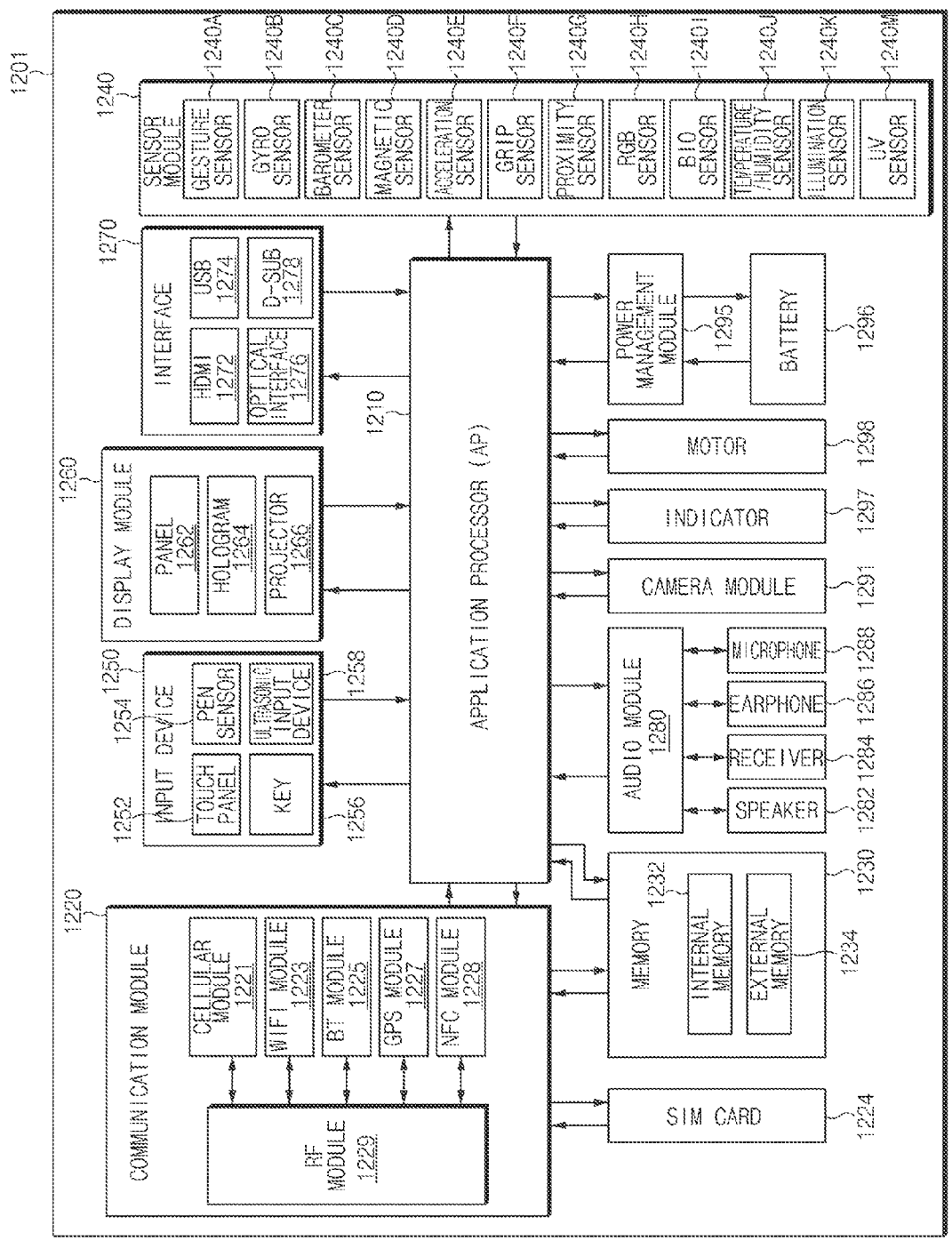
FIG. 12 is a block diagram illustrating an electronic device according to an embodiment of the present disclosure.

FIG. 12 is a block diagram illustrating an electronic device according to an embodiment of the present disclosure.

Referring to FIG. 12, an electronic device 1201 is illustrated, where the electronic device 1201 may constitute at least one portion of the electronic device 1 illustrated in FIG. 1. Referring to FIG. 12, the electronic device 1201 may include at least one application processor (AP) 1210, a communication module 1220, a subscriber identification module (SIM) card 1224, a memory 1230, a sensor module 1240, an input device 1250, a display module 1260, an interface 1270, an audio module 1280, a camera module 1291, a power management module 1295, a battery 1296, an indicator 1297 and a motor 1298.

The AP 1210 may run an operating system or an application program so as to control a plurality of hardware or software elements connected to the AP 1210, and may process various data including multimedia data and may perform an operation. The AP 1210 may be formed as, for example, a system on chip (SoC). According to an embodiment, the AP 1210 may further include a graphic processing unit (GPU, which is not illustrated).

The communication module 1220 may perform data transmission/reception for communication between the electronic device 1201 and another electronic device connected thereto through a network. According to an embodiment, the communication module 1220 may include a cellular module 1221, a WiFi module 1223, a Bluetooth (BT) module 1225, a GPS module 1227, a near-field communication (NFC) module 1228, and a radio frequency (RF) module 1229.

The cellular module 1221 may provide a voice call service, a video call service, a text message service, or an Internet service through a communications network (e.g., long term evolution (LTE), LTE-advanced (LTE-A), code division multiple access (CDMA), wideband CDMA (WCDMA), universal mobile telecommunications system (UMTS), wireless broadband (WiBro) or global system for mobile communications (GSM) network). Furthermore, the cellular module 1221 may identify and authenticate electronic devices in the communications network using, for example, a subscriber identification module (e.g., the SIM card 1224). According to an embodiment, the cellular module 1221 may perform at least one of functions provided by the AP 1210. For example, the cellular module 1221 may perform at least one portion of a multimedia control function.

According to an embodiment, the cellular module 1221 may include a communication processor (CP). The cellular module 1221 may be formed as, for example, a SoC.

According to an embodiment, the AP 1210 or the cellular module 1221 (e.g., a communication processor) may load, on a volatile memory, a command or data received from a nonvolatile memory connected to the AP 1210 or the cellular module 1221 or from at least one of other elements, so as to process the command or data. Furthermore, the AP 1210 or cellular module 1221 may store, in the nonvolatile memory, data received from or generated by at least one of the other elements.

Each of the WiFi module 1223, the BT module 1225, the GPS module 1227 and the NFC module 1228 may include, for example, a processor for processing data transmitted/received through the modules.

According to an embodiment, at least one part (e.g., two or more) of the cellular module 1221, the WiFi module 1223, the BT module 1225, the GPS module 1227 and the NFC module 1228 may be included in a single integrated chip (IC) or IC package. For example, at least one part (e.g., a communication processor corresponding to the cellular module 1221 and a WiFi processor corresponding to the WiFi module 1223) of processors corresponding, respectively, to the cellular module 1221, the WiFi module 1223, the BT module 1225, the GPS module 1227 and the NFC module 1228 may be formed as a single SoC.

The RF module 1229 may transmit/receive data, for example, may transmit/receive an RF signal. Although not illustrated, for example, a transceiver, a power amp module (PAM), a frequency filter or a low noise amplifier (LNA) may be included in the RF module 1229. Furthermore, the RF module 1229 may further include a component such as a conductor or a wire for transmitting/receiving free-space electromagnetic waves in a wireless communication system.

According to an embodiment, at least one of the cellular module 1221, the WiFi module 1223, the BT module 1225, the GPS module 1227 and the NFC module 1228 may transmit/receive RF signals through a separate RF module.

The SIM card 1224 may include a subscriber identification module, and may be inserted into a slot formed at a specific location of the electronic device. The SIM card 1224 may include unique identification information (e.g., an integrated circuit card identifier (ICCID)) or subscriber information (e.g., international mobile subscriber identity (IMSI)).

The memory 1230 may include an internal memory 1232 or an external memory 1234. For example, the internal memory 1232 may include at least one of a volatile memory (e.g., a dynamic RAM (DRAM), a static RAM (SRAM) or a synchronous dynamic RAM (SDRAM)) and a nonvolatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a NAND flash memory, or a NOR flash memory).

According to an embodiment, the internal memory 1232 may be a solid state drive (SSD). The external memory 1234 may include a flash drive, for example, compact flash (CF), secure digital (SD), micro secure digital (Micro-SD), mini secure digital (Mini-SD), extreme digital (xD) or a memory stick. The external memory 1234 may be functionally connected to the electronic device 1201 through various interfaces. According to an embodiment, the electronic device 1201 may further include a storage device (or a storage medium) such as a hard drive.

The sensor module 1240 may measure physical quantity or sense an operation state of the electronic device 1201 so as to convert measured or sensed information into an electrical signal. The sensor module 1240 may include, for example, at least one of a gesture sensor 1240A, a gyro sensor 1240B, an atmospheric pressure sensor 1240C (e.g., a barometer sensor), a magnetic sensor 1240D, an accelerometer/acceleration sensor 1240E, a grip sensor 1240F, a proximity sensor 1240G, a color sensor 1240H (e.g., an RGB sensor), a biometric/bio sensor 1240I, a temperature/humidity sensor 1240J, an illuminance/illumination sensor 1240K, and an ultraviolet (UV) sensor 1240M. Additionally or alternatively, the sensor module 1240 may include, for example, an olfactory sensor (E-nose sensor, not illustrated), an electromyography (EMG) sensor (not illustrated), an electroencephalogram (EEG) sensor (not illustrated), an electrocardiogram (ECG) sensor (not illustrated), an infrared (IR) sensor (not illustrated), an iris recognition sensor (not illustrated), or a fingerprint sensor (not illustrated). The sensor module 1240 may further include a control circuit for controlling at least one sensor included therein.

The input device 1250 may include a touch panel 1252, a digital pen sensor 1254, a key 1256, or an ultrasonic input device 1258. For example, the touch panel 1252 may recognize a touch input using at least one of capacitive, decompression, infrared and ultrasonic sensing methods. The touch panel 1252 may further include a control circuit. When using the capacitive sensing method, a physical contact recognition or proximity recognition is allowed. The touch panel 1252 may further include a tactile layer. Accordingly, the touch panel 1252 may provide tactile reaction to a user.

For example, the digital pen sensor 1254 may be embodied in a similar or same manner as that for receiving a touch input of a user, or may be formed using a separate sheet for recognition. The key 1256 may include, for example, a physical button, an optical button, or a keypad. The ultrasonic input device 1258 uses an input tool for generating an ultrasonic signal to sense a sound wave through a microphone (e.g., a microphone 1288) of the electronic device 1201 and identify data, and is capable of wireless recognition. According to an embodiment, the electronic device 1201 may use the communication module 1220 to receive a user input from an external device (e.g., a computer or server) connected to the communication module 1220.

The display module 1260 may include a panel 1262, a hologram device 1264, or a projector 1266. The panel 1262 may be, for example, a liquid crystal display (LCD) or an active-matrix organic light-emitting diode (AM-OLED). The panel 1262 may be, for example, flexible, transparent or wearable. The panel 1262 and the touch panel 1252 may be integrated into a single module. The hologram device 1264 may display a stereoscopic image in a space using a light interference phenomenon. The projector 1266 may project light onto a screen so as to display an image. For example, the screen may be arranged at the inside or the outside of the electronic device 1201. According to an embodiment, the display module 1260 may further include a control circuit for controlling the panel 1262, the hologram device 1264, or the projector 1266.

The interface 1270 may include, for example, a high definition multimedia interface (HDMI) 1272, a universal serial bus (USB) 1274, an optical interface 1276, or a D-subminiature (D-sub) 1278. The interface 1270 may include, for example, a mobile high-definition link (MHL) interface, a secure digital (SD) card/multi-media card (MMC) interface, or an infrared data association (IrDA) interface.

The audio module 1280 may convert a sound into an electrical signal or vice versa. For example, the audio module 1280 may process sound information input or output through a speaker 1282, a receiver 1284, an earphone 1286, or the microphone 1288.

According to an embodiment, the camera module 1291 for capturing a still image or a video may include at least one image sensor (e.g., a front sensor or a rear sensor), a lens (not illustrated), an image signal processor (ISP, not illustrated), or a flash (e.g., an LED or a xenon lamp, not illustrated).

The power management module 1295 may manage power of the electronic device 1201. Although not illustrated, the power management module 1295 may include, for example, a power management integrated circuit (PMIC), a charger integrated circuit (IC), or a battery or fuel gauge.

For example, the PMIC may be mounted in an integrated circuit or an SoC semiconductor. Charging methods may be classified into wired charging methods and wireless charging methods. The charger IC may charge a battery and prevent an overvoltage or an overcurrent from being introduced from a charger. According to an embodiment, the charger IC may include a charger IC for at least one of the wired charging methods and the wireless charging methods. The wireless charging methods may include, for example, a magnetic resonance method, a magnetic induction method or an electromagnetic method, and may include an additional circuit for wireless charging, for example, a coil loop, a resonant circuit, or a rectifier.

The battery gauge may measure, for example, a remaining capacity of the battery 1296, or a voltage, current or temperature thereof while the battery 1296 is charged. The battery 1296 may store or generate electricity, and supply power to the electronic device 1201 by using the stored or generated electricity. The battery 1296 may include, for example, a rechargeable battery or a solar battery.

The indicator 1297 may display a specific state of the electronic device 1201 or a portion thereof (e.g., the AP 1210), such as a booting state, a message state, or a charging state. The motor 1298 may convert an electrical signal into a mechanical vibration. Although not illustrated, a processing device (e.g., a GPU) for supporting a mobile TV may be included in the electronic device 1201. For example, the processing device for supporting a mobile TV may process media data according to the standards of digital multimedia broadcasting (DMB), digital video broadcasting (DVB) or media flow.

Each of the above-mentioned elements of the electronic device according to the present disclosure may be configured with one or more components, and the names of the elements may be changed according to the type of the electronic device. The electronic device according to the present disclosure may include at least one of the above-mentioned elements, and a part of the elements may be omitted or other additional elements may be added. Furthermore, elements as a part of the elements of the electronic device according to the present disclosure may be combined with each other so as to form one entity, so that the functions of the elements may be performed in the same manner as that before the combination.

The term "module" used herein may represent, for example, a unit including one or more combinations of hardware, software and firmware. For example, the term "module" may be interchangeably used with the term "unit," "logic," "logical block," and a "component" or a "circuit." The "module" may be a minimum unit of an integrated component or may be a part thereof. The "module" may be a minimum unit for performing one or more functions or a part thereof. The "module" may be mechanically or electronically formed. For example, the "module" according to the present disclosure may include at least one of an application-specific integrated circuit (ASIC) chip, a field-programmable gate array (FPGA), and a programmable-logic device for performing operations, which are known or will be developed.

According to various embodiments, at least one part of devices (e.g., modules or functions thereof) or methods (e.g., operations) according to the present disclosure may be embodied as instructions stored in a computer-readable storage medium in the form of a programming module. When the instructions are performed by at least one processor, the at least one processor may perform functions corresponding to the instructions. At least one part of the programming module may include, for example, a module, program, routine, sets of instructions, or process for performing at least one function.

The computer-readable storage medium may include a magnetic medium such as a hard disk, a floppy disk and a magnetic tape, an optical medium such as a compact disk read only memory (CD-ROM) and a DVD, a magneto-optical medium such as a floptical disk, and a hardware device specifically configured to store and execute program instructions (e.g., a programming module), such as a read only memory (ROM), a random access memory (RAM) and a flash memory. The program instructions may include machine language codes made by compilers and high-level language codes that can be executed by computers using interpreters. The above-mentioned hardware device may be configured to be operated as one or more software modules for performing operations of the present disclosure and vice versa.

The module or programming module according to the present disclosure may include at least one of the above-mentioned elements, or a part thereof may be omitted, or other additional elements may be included therein. Operations performed by the module, the programming module or the other elements according to the present disclosure may be performed in a sequential, parallel, iterative or heuristic way. Furthermore, a part of the operations may be performed in another order or be omitted, or other operations may be added thereto.

According to the various embodiments of the present disclosure, a cover holding unit is installed on an electronic device, and the electronic device and the cover are removed from and attached to each other by removing and attaching a connecting protrusion formed on a cover, from and to the cover holding unit. Accordingly, a connecting structure for connecting the cover to the electronic device can be miniaturized, and thus, the appearance and portability of the electronic device can be improved.

In addition, since the cover is removed from the electronic device just by pulling the cover attached to the electronic device, although the connecting structure is miniaturized, the removal of the cover is convenient.

In addition, the cover holding unit is modularized and can be thus applied to various electronic devices. Accordingly, a common cover connecting structure can be applied to various electronic devices.

Furthermore, when a plurality of covers, which are different in shape or area and are designed to be attached to a specific electronic device, are connected to an electronic device (for example, which is not the specific electronic device), it is unnecessary to change a connecting structure for connecting a cover to the electronic device according to the various embodiments of the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   an electronic device body;
   a recess formed in an outer surface of the electronic device body and configured to receive a fastening member of a supplementary apparatus;
   a movable member placed in the recess;
   an elastic member placed in the recess and supporting the movable member; and
   a retaining member placed in the recess and disposed around the movable member,
   wherein the retaining member is configured to move upward or downward corresponding to a movement of the movable member,
   wherein the elastic member and the movable member are disposed to elastically bias the movable member from an inside of the recess to the outer surface of the electronic device body,
   wherein the movable member further comprises an electrical contact for receiving an electrical input from the supplementary apparatus, and
   wherein the fastening member is configured to be disposed in the recess to fasten the supplementary apparatus to the electronic device.

2. The electronic device according to claim 1, wherein the fastening member is configured to bias the elastic member and displace the movable member.

3. The electronic device according to claim 2, wherein the supplementary apparatus further includes an electrical contact configured to contact the electrical contact of the movable member.

4. The electronic device according to claim 2, wherein the electronic device includes a mobile electronic device, and the supplementary apparatus includes a cover for covering at least one portion of the electronic device.

5. The electronic device according to claim 2, wherein the electronic device includes a mobile electronic device, and the supplementary apparatus includes a keyboard for performing an input operation on the electronic device.

6. An electronic device attachable to a cover, the electronic device comprising:
   an electronic device body including an installation space part;
   a cover holding unit installed in the installation space part;
   an installation bracket connected to the electronic device body to prevent the cover holding unit, which is installed in the installation space part, from being removed from the electronic device body;

a fastener configured to receive a fastening member for fastening a supplementary apparatus to the electronic device body; and a movable cap configured to cover the fastener, the movable cap being configured to displace into the electronic device body when the fastening member biases the movable cap to fasten the supplementary apparatus to the electronic device body, wherein, when the supplementary apparatus is not fastened to the electronic device body, the movable cap is substantially planar to an outer surface of the electronic device body, and wherein the movable cap further comprises an electrical contact for receiving an electrical input from the supplementary apparatus when the cover is fastened to the electronic device body.

7. The electronic device according to claim 6, wherein the electronic device includes a base plate, wherein the base plate includes wing parts each having an upwardly bent shape and each including a slot, and wherein the slot of each respective wing part of the base plate is configured to engage a portion of the fastener.

8. The electronic device according to claim 6, wherein the fastener includes a housing configured to secure the movable cap to the fastener.

9. The electronic device according to claim 8, wherein the fastener further includes an elastic member accommodated in the housing to elastically bias the movable cap to the outer surface of the electronic device body.

10. The electronic device according to claim 9, wherein the housing has a flat circumferential shape, and wherein the base plate is thinner than the housing and covers an inner end part of the housing.

11. The electronic device according to claim 8, wherein the movable cap includes a raised part configured to be caught by an outer end part of the housing to prevent the movable cap from being removed from the housing.

12. The electronic device according to claim 8, wherein the housing includes a raised part configured to be caught by an opening part of the fastener to prevent the housing from being removed from the electronic device body.

* * * * *